US010148416B2

(12) United States Patent
Morris et al.

(10) Patent No.: US 10,148,416 B2
(45) Date of Patent: Dec. 4, 2018

(54) SIGNAL PHASE OPTIMIZATION IN MEMORY INTERFACE TRAINING

(71) Applicant: Intel Corporation, Santa Clara, CA (US)

(72) Inventors: Tonia G Morris, Irmo, SC (US); Ying Zhou, Portland, OR (US); John V. Lovelace, Irmo, SC (US); Alberto David Perez Guevara, Zapopan (MX)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/255,564

(22) Filed: Sep. 2, 2016

(65) Prior Publication Data

US 2018/0069692 A1  Mar. 8, 2018

(51) Int. Cl.
*H04L 7/00* (2006.01)
*G11C 7/00* (2006.01)
*G11C 29/02* (2006.01)
*H04L 7/033* (2006.01)

(52) U.S. Cl.
CPC .............. *H04L 7/0041* (2013.01); *G11C 7/00* (2013.01); *G11C 29/023* (2013.01); *G11C 29/028* (2013.01); *H04L 7/0004* (2013.01); *H04L 7/0008* (2013.01); *H04L 7/0037* (2013.01); *H04L 7/0331* (2013.01)

(58) Field of Classification Search
USPC ........................................ 327/146, 153, 160
See application file for complete search history.

(56) References Cited

U.S. PATENT DOCUMENTS

| 8,829,957 B1* | 9/2014 | Fluegel ..................... H03L 7/00 327/146 |
| 9,025,399 B1 | 5/2015 | Morris et al. |
| 2008/0133958 A1* | 6/2008 | Cranford ................ B82Y 25/00 713/600 |
| 2014/0181429 A1 | 6/2014 | Malladi et al. |
| 2015/0095565 A1 | 4/2015 | Morris et al. |
| 2015/0149156 A1* | 5/2015 | Atti ........................ G10L 19/265 704/205 |

OTHER PUBLICATIONS

"AND9075/D; Understanding Data Eye Diagram Methodology for Analyzing High Speed Digital Signals", Semiconductor Components Industries, LLC: www.onsemi.com, Publication No. AND9075/D, Jun. 2015, pp. 1-7.

(Continued)

*Primary Examiner* — Eva Puente
(74) *Attorney, Agent, or Firm* — Compass IP Law PC

(57) ABSTRACT

Embodiments are generally directed to signal phase optimization in memory interface training. An embodiment of an apparatus includes an interface for at least one signal; and interface training logic capable of automatically adjusting a phase relationship between the signal and a strobe or clock, including establishing a phase delay of the signal and a phase delay of the strobe or clock for training of the interface, wherein the interface training logic is capable of determining a phase delay reduction for the signal subsequent to measurement of an eye margin for the signal, the phase delay reduction to retain a sufficient delay to maintain the eye margin for sampling of the signal.

15 Claims, 9 Drawing Sheets

(56) References Cited

OTHER PUBLICATIONS

Anritsu, "Understanding Eye Pattern Measurements", *Anritsu Company*, Application Note No. 114 10-00533, Rev. A Printed in United States Mar. 2010, 20 pages.
Behera, Deepak, et al., "Eye Diagram Basics: Reading and Applying Eye Diagrams", Freescale Semiconductor: http://www.edn.com/design/test-and-measurement/4389368/Eye-Diagram-Basics-Reading-and-applying-eye-diagrams, Dec. 16, 2011, pp. 1-6.
Keysight Technologies, "Reliable State Measurements on High-Speed Buses", http://www.keysight.com/upload/cmc_upload/All/EPSG083664.pdf, May 5, 2000, 6 pages.

\* cited by examiner

SIGNAL PHASE OPTIMIZATION IN MEMORY INTERFACE TRAINING

TECHNICAL FIELD

Embodiments described herein generally relate to the field of electronic devices and, more particularly, signal phase optimization in memory interface training.

BACKGROUND

In high-end computing systems such as servers and workstations, there is necessarily a strong focus on stability and performance, especially with regards to high speed interfaces. In this regard, hardware and software elements are finely tuned to obtain the largest possible eye margin, the eye margin being amount of time measured between the setup time (time that data is required to remain stable prior to sampling) of the signal to the hold time (time that the data is required to remain stable subsequent to sampling) of the same signal.

In operation, larger signal eyes correspond to a larger margin, and thus greater operational stability. A larger eye allows the signal to be sampled more reliably and makes the interface more resilient to errors, such as cross talk interference, inter-symbol interference, and power fluctuations that might occur during operation.

In interface training, high speed interconnects are able to programmatically control the phase relationship between the sampling "strobe" and the signal to be sampled to adjust the phase relationship. The control over the phase relationship may be implemented using various circuit implementations to create delay stages within the IO (Input Output) circuit. In certain cases, both the signal and the sampling strobe must be delayed in the interface training process.

However, when a phase delay is applied to the actual signal (in addition to the sampling strobe) via enablement of additional delay stage circuitry, there are consequences of increased power and latency in operation. This increase in latency creates a negative impact on performance of the system.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
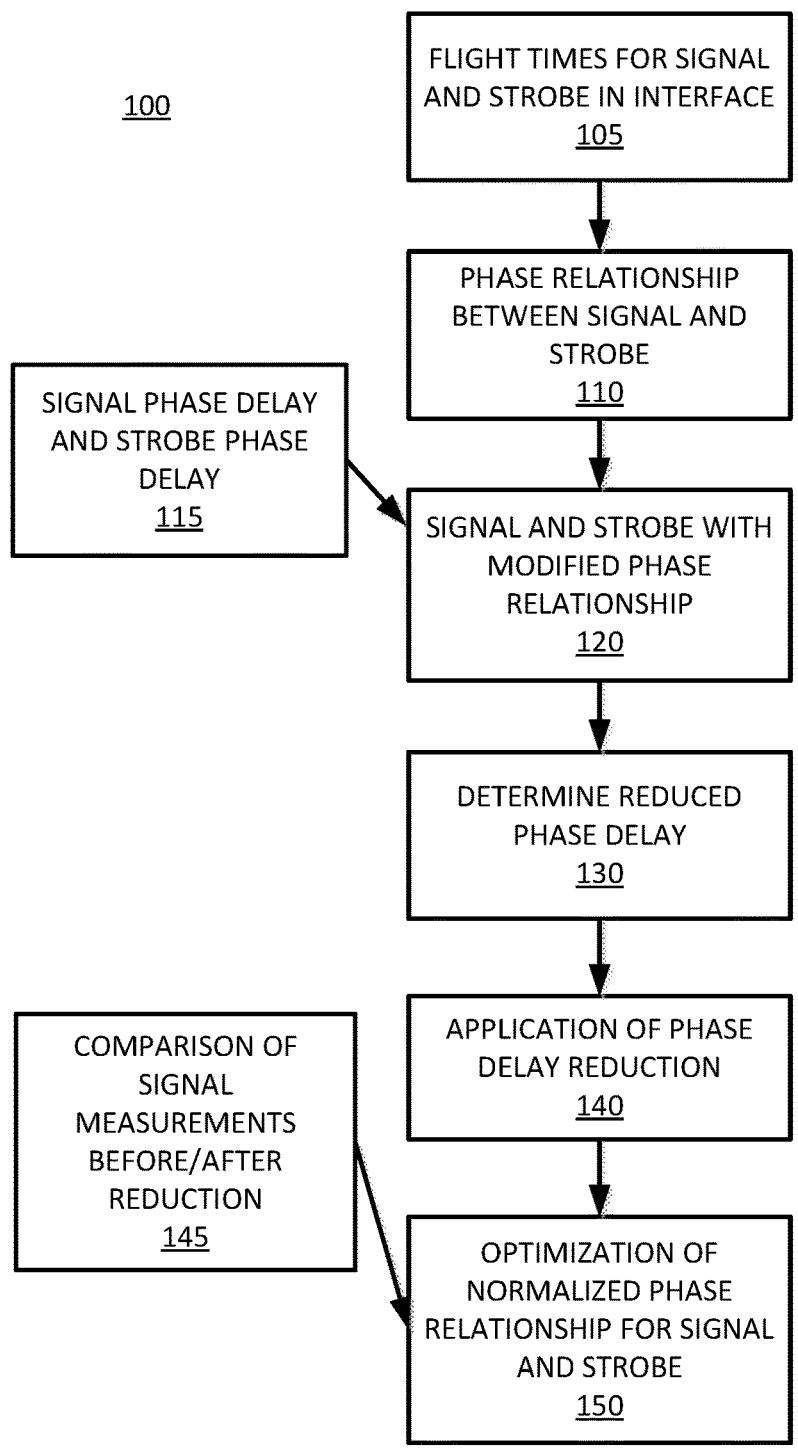
FIG. 1 is an illustration of a system and process for memory interface training according to an embodiment.

Embodiments described herein are generally directed to signal phase optimization in memory interface training.

For the purposes of this description:

"Eye diagram" or "eye pattern" is a display of digital signals that are repetitively sampled.

"Eye margin" refers to an amount of time between a setup time of a signal and a hold time of the same signal. "Setup time" refers to the time that data is required to remain stable (with no data transitions) prior to a clock transition (for sampling of the signal), and "hold time" refers to the time that the data is required to remain stable subsequent to the clock transition.

Interface training is a process that compensates for timing mismatches for an interface. In an interconnect of a system, such as a high speed interconnect, a memory training logic or process may programmatically control the phase relationship between a sampling strobe and a signal to be sampled using the strobe by implementing certain delay stages within the IO (Input Output) circuit. The training may include sweeping through delay settings (sampling a signal at each possible delay setting) to determine operational limits. Interface training may include, but is not limited to, training for a memory interface for DDR (Double Data Rate) SDRAM (Synchronous Dynamic Random Access Memory), HBM (High Bandwidth Memory), and other high speed interface technologies, and may regard, for example, training for BIOS (Basic Input/Output System) MRC (Memory Reference Code) initialization.

An interface training process may include measurement of the eye margin for the interface. In this measurement, it may be necessary to delay both the signal to be sampled and the sampling strobe in order to measure the setup edge (at the start of the setup time) of the signal.

However, in many cases the signal is required to be delayed only for the measurement of the setup edge when measuring the eye margin. Once the eye margin has been measured and the center position of the eye has been determined, the delay stages provided by additional circuitry for the signal are no longer required, and the signal phase delay may be removed for operation by disabling some or all of the delay circuitry elements that are generating the signal phase delay.

The removal of all or part of the signal phase delay (a process that may be referred to as normalization) has certain implications for interface operation because the removal of the phase delay limits the ability to measure the setup edge of the eye when sweeping through the phase delay settings for the strobe signal. However, the electrical margin (which may also be referred to as the physical margin) is still present and unchanged on the interface. Removing the phase delay for the signal and compensating for this change in the strobe timing affects the measured margin by losing the sample point of the setup edge for measurement, but does not affect the total margin as the center point is still well calibrated between the electrical setup time and hold time.

Performing normalization of the phase delay settings on a command signal or data signal provides benefits in latency reductions and effective power savings. For this reason, normalization training is valuable for the command and data interfaces. However, normalization requires maintaining sufficient phase delay as required for electrical restraints in an interface.

In some embodiments, an apparatus, system, or process provides for automatic signal phase optimization in interface training, including determination of signal phase delay reduction to provide power and latency reduction in memory interface training.

FIG. 1 is an illustration of a system and process for memory interface training according to an embodiment. Further details regarding application of one or more algorithms for optimization are provided in FIGS. 2A-2D. In memory interface training for a particular interface 100, the differing propagation delay for a signal and a strobe in an interface 105 (sometimes referred to as the "flight time" for the signal or strobe) result in a particular initial phase relationship between the signal and the strobe 110. In order to allow for measurement of an eye margin for the signal, signal phase delay and strobe phase delay are added 115, resulting in the signal and strobe with a modified phase relationship 120. The circuitry elements to provide the phase delay may include any existing technology for the implementation of a variable phase delay for a signal.

However, because of costs in latency and power consumption that are side effects resulting from such signal phase delay, there is a need to normalize the signal by reducing or eliminating the signal phase delay by disabling the appropriate delay circuitry elements. In some embodiments, a reduced phase delay is determined 130 and the phase delay reduction is applied to the signal 140. In some embodiments, because of the need to provide for measurement of the setup edge to maintain the measurement of the eye margin or for certain limitations in the IO circuit, an algorithm provides for a determination of a maximum allowable phase delay reduction that will provide for a workable phase shift that maintains the eye margin for signal sampling. In some embodiments, in an alternative algorithm a phase delay may be reduced gradually.

In some embodiments, upon applying delay reduction, delta changes in signal measurements before and after application of the reduction in phase delay 145 are utilized in developing an optimized phase delay for the interface 150.

Figure 2A:
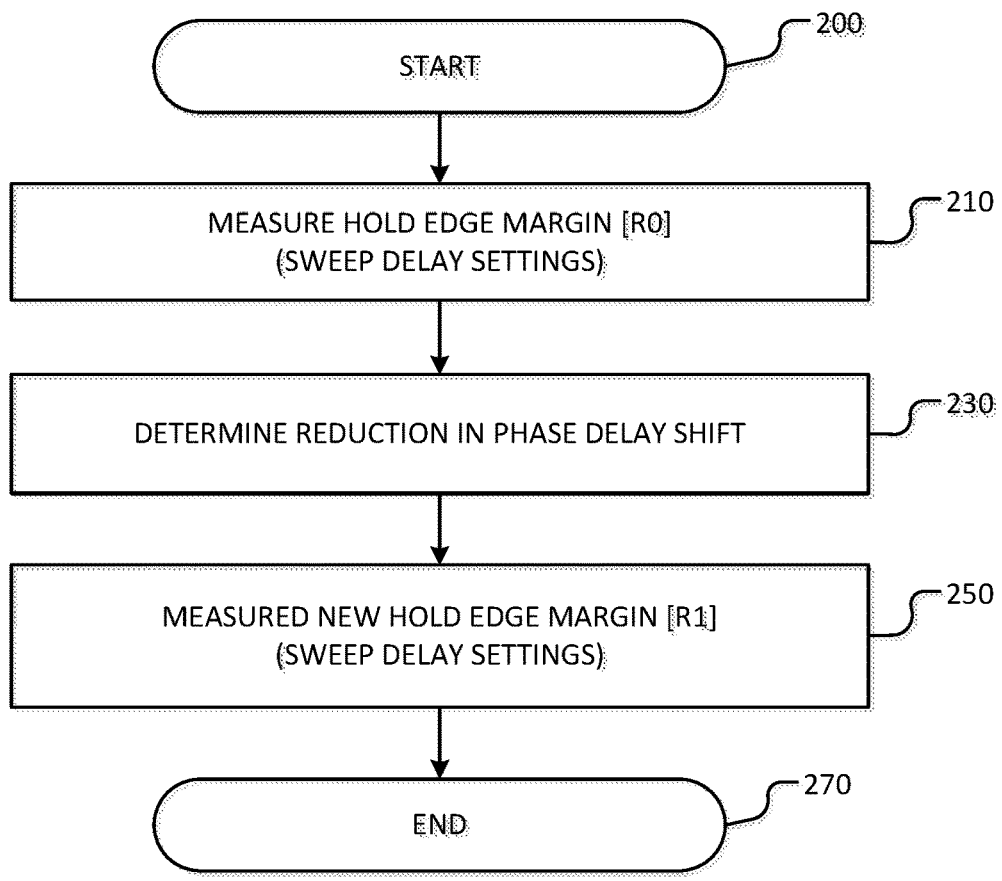
FIGS. 2A-2C are flowcharts to illustrate application of a first algorithm for memory interface training according to an embodiment.
Figure 2B:
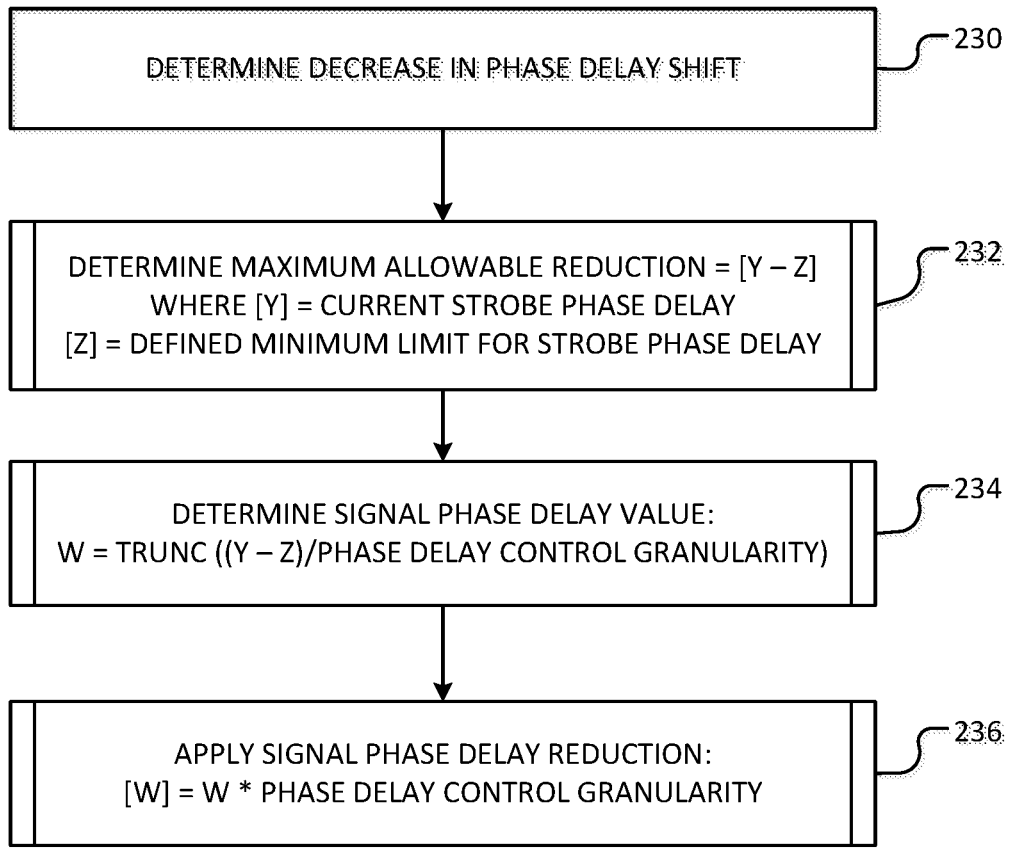
Figure 2C:
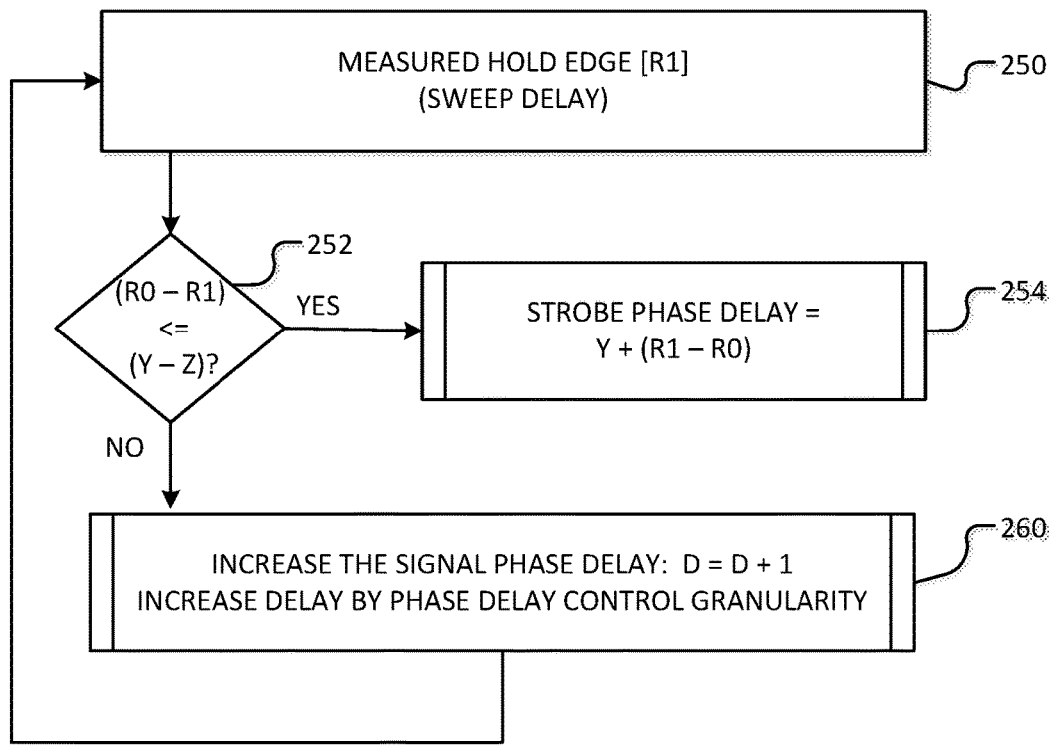

FIGS. 2A-2C are flowcharts to illustrate application of a first algorithm for memory interface training according to an embodiment. In some embodiments, a process may include, but is not limited to, the following:

210: Measure the hold edge [R0] of the signal (which may include a measurement for each signal group of multiple signal groups) by sampling the signal at each possible delay setting (which be referred to as sweeping the phase delay settings).

230: Determine a reduction in the phase delay shift (a reduction in number of delay stages) that can be applied while retaining a phase delay that is sufficient for measurement of the eye margin.

250: Measure the new hold edge [R1] by sweeping the phase delay settings.

In some embodiments, a process may further include the following:

230: To determine a reduction in the phase delay shift that can be applied:

232: Determine maximum allowable reduction value Y−Z, wherein Y is the current strobe phase delay at the applicable strobe granularity and Z is a defined minimum limit for the strobe phase delay.

234: For a maximum allowable reduction of Y−Z and a particular phase control granularity, determine a signal phase delay value W (delay that can be applied to the signal based on the strobe phase setting limits): W=truncated value ((Y−Z)/phase delay control granularity).

236: Determine and apply a phase delay reduction in both positive and negative edges by disabling of the appropriate delay circuitry elements, the phase delay reduction for the positive and negative edges being by a same scaled amount [W]=W*phase delay control granularity.

In some embodiments, a process may further include the following:

250: Upon measuring the new hold edge [R1] by sweeping the phase delay settings, the process further including:

252: Compare the difference between the new hold edge and the previous (R1−R0) to (Y−Z).

254: For (R1−R0) less than or equal to (Y−Z), the strobe phase delay equals Y plus the hold edge difference (R1−R0).

260: Otherwise, for (R1−R0) greater than (Y−Z), increase the phase delay (by the phase delay control granularity) and repeat the measurement of the hold edge R1 in process 250.

Figure 2D:
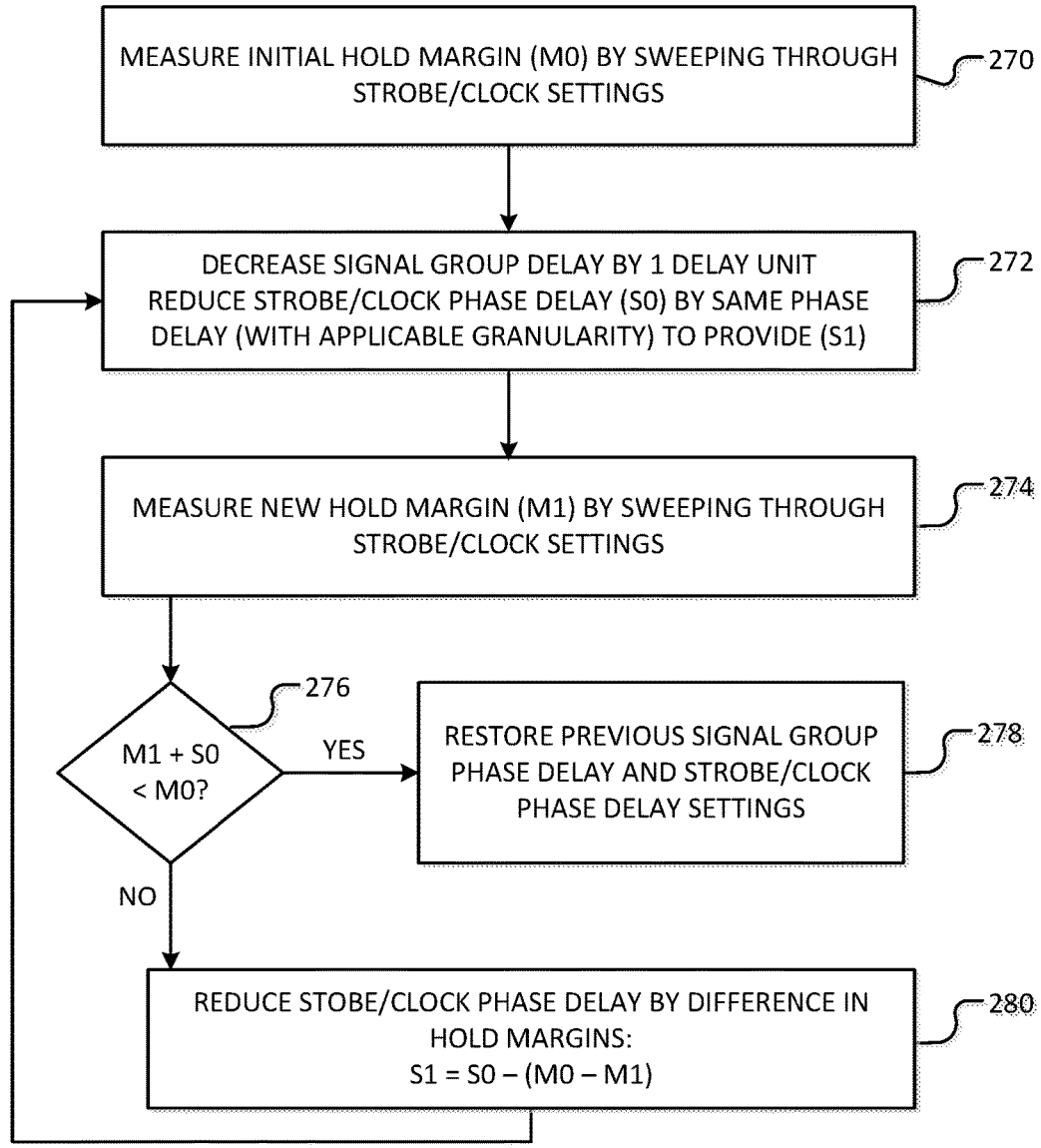
FIG. 2D is a flowchart to illustrate application of a second algorithm for memory interface training according to an embodiment.

FIG. 2D is a flowchart to illustrate application of a second algorithm for memory interface training according to an embodiment. In some embodiments, normalization of the phase relationship for an interface includes the following:

270: For each signal group, measure an initial hold margin M0 by sweeping through the strobe/clock settings.

272: Decrease the signal group delay by 1 unit and reduce the strobe/clock value by the same phase delay (which may be encoded as a different granularity for the strobe/clock).

274: For each signal group, measure the new hold margin M1 (by sweeping the strobe/clock settings).

276: Determine whether the new hold margin M1 plus the current strobe/clock setting S0 is less than the previous hold margin M0.

278: Upon determining that M1+S0<M0, restore the previous Signal Group Delay and Strobe/Clock settings (as the applied delay reduction is too large and does not retain a sufficient signal phase delay).

280: Otherwise, decrease the strobe/clock setting S0 by the difference (previous hold margin−new hold margin) to generate new setting S1, and return to process 272.

Figure 3:
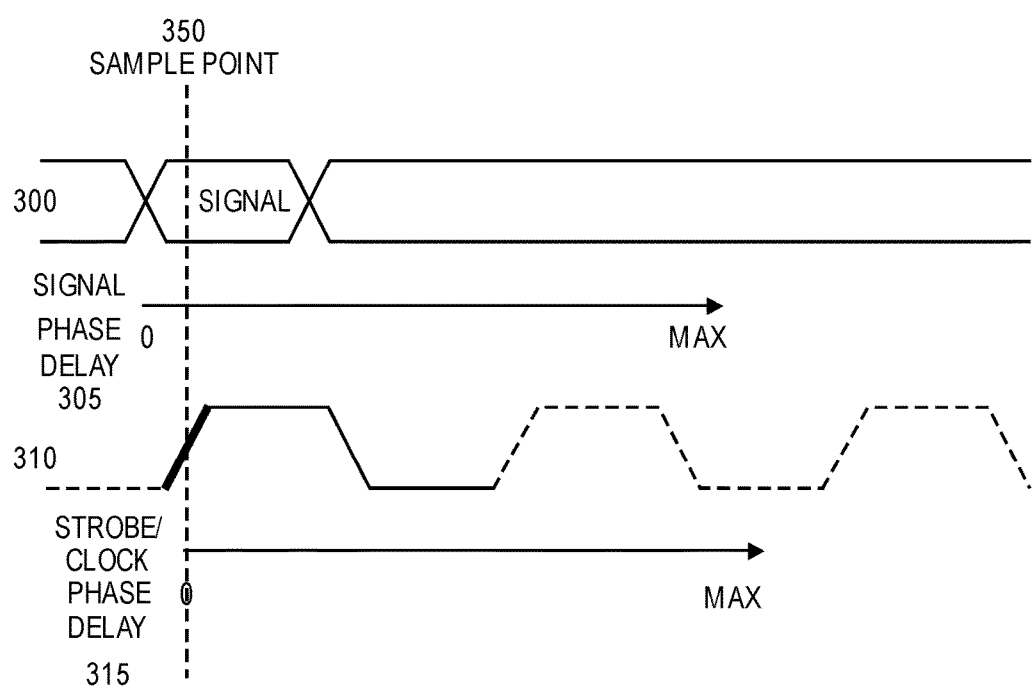
FIG. 3 is an illustration of data or command interface signals in an interface training process according to an embodiment.

FIG. 3 is an illustration of data or command interface signals in an interface training process according to an embodiment. To illustrate the implementation of an algorithm in an embodiment of an apparatus, system, or process, FIG. 3 illustrates a typical scenario regarding a data or command signal 300 with respect to the strobe or clock signal 310, wherein the data/command signal may be delayed by a signal phase delay 305 and the strobe/clock may be delayed by strobe/clock phase delay 315. In this instance, the strobe/clock indicates a particular sample point 350.

However, in this phase relationship there is no range to measure the setup margin, with the delta value between the signal 300 and strobe/clock 310 resulting from differences in the propagation delay between the signal and the strobe/clock in the strobe clock. To allow measurement of the setup margin, the signal sample is delayed by a certain X amount signal phase delay, thus enabling sampling and measurement of both setup and hold times by sweeping the strobe/clock.

Figure 4:
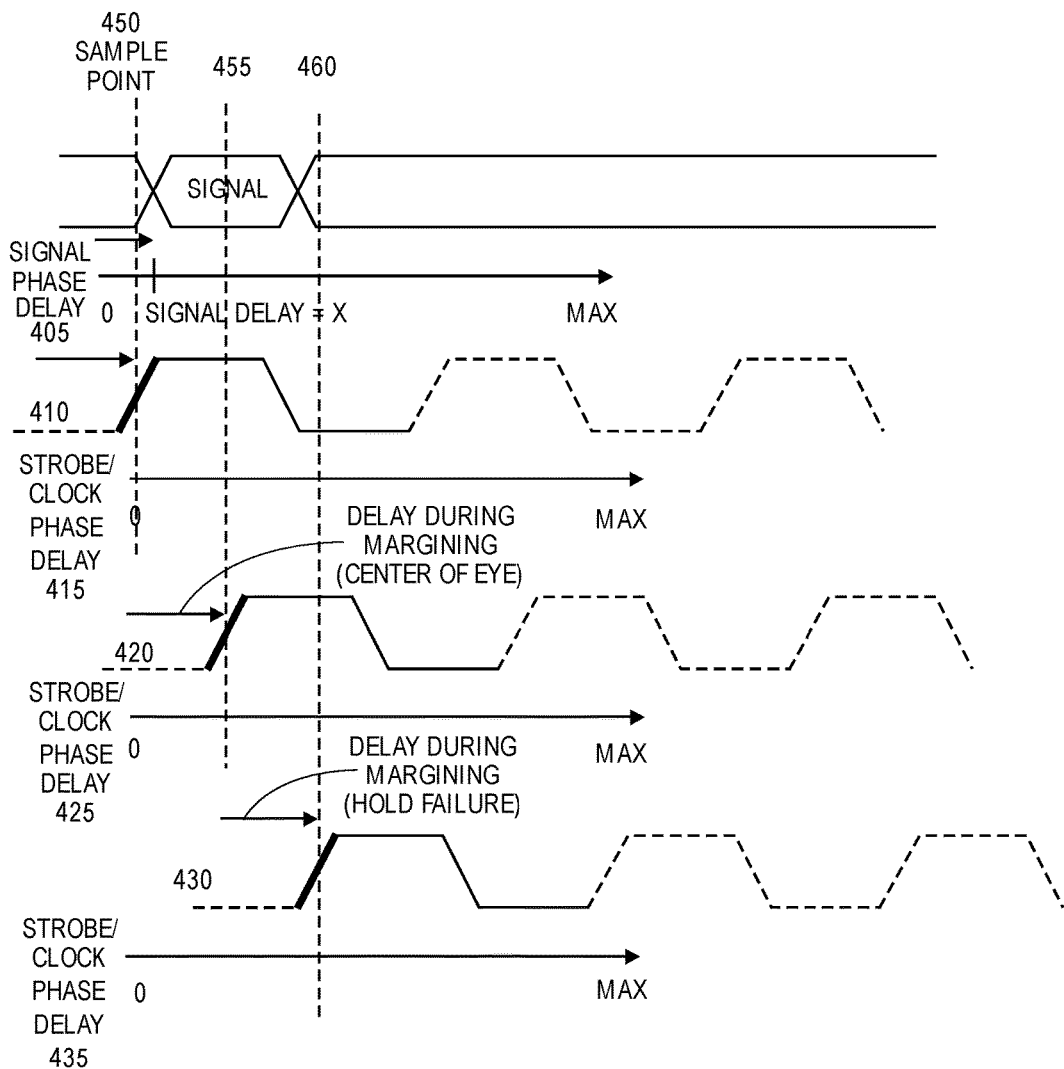
FIG. 4 is an illustration of measurement of setup and hold times in a process according to an embodiment.

FIG. 4 is an illustration of measurement of setup and hold times in a process according to an embodiment. In FIG. 4, setup and hold times may be measured by imposing the signal phase delay X, and sweeping through the strobe/clock values. In this illustration, the signal 400 delayed by the signal phase delay 405 is sampled by the swept values strobe/clock 410 delayed by strobe/clock phase delay 415, resulting in sample point 450; sampled by the strobe/clock 420 delayed by strobe/clock phase delay 425, resulting in sample point 455; and sampled by strobe/clock 430 delayed by strobe/clock phase delay 435, resulting in sample point 460.

In this example, the optimal training value is identified to be in the center of the signal eye, such as sample point 455. This timing relation will be maintained as the signal and strobe phase delays are modified.

Figure 5:
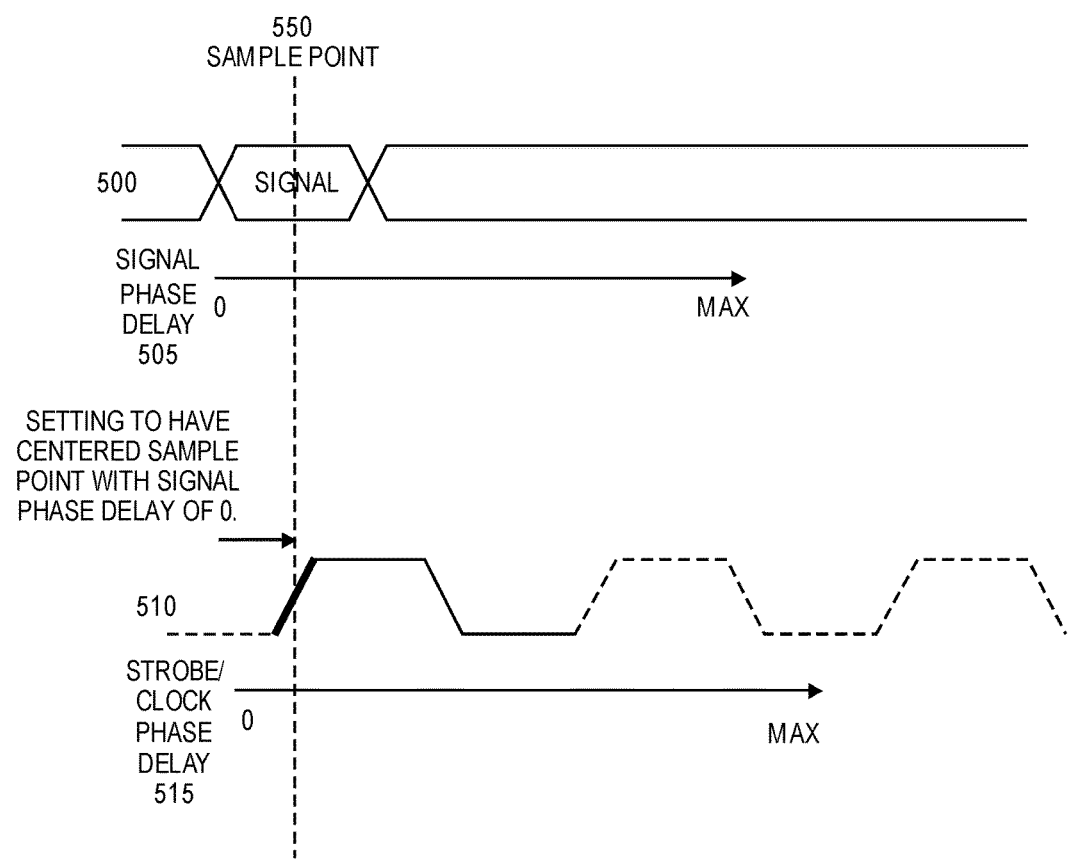
FIG. 5 is an illustration of measurement of normalized signals for an interface process according to an embodiment.

FIG. 5 is an illustration of measurement of normalized signals for an interface process according to an embodiment. In some embodiments, when the final training value set (the set of values representing the signal and strobe phase delay for the interface) is determined and normalized to fully reduce the signal phase delay, the signal 500 with zero signal phase delay 505 and strobe/clock with established strobe/clock phase delay 515, the sample point 550 being the center of the signal eye with the latency and power optimized for signal phase delay.

However, the setup edge can no longer be measured with this signal phase delay as illustrated in FIG. 5. In some embodiments, an algorithm, such as the first algorithm illustrated in FIGS. 2A-2C or the second algorithm illustrated in FIG. 2D, is applied to the training value set to establish a signal phase delay reduction. In some embodiments, the application of the algorithm results in a reduced signal phase delay that reduces latency and power consumption issues, while retaining a sufficient signal phase delay for the interface.

Figure 6:
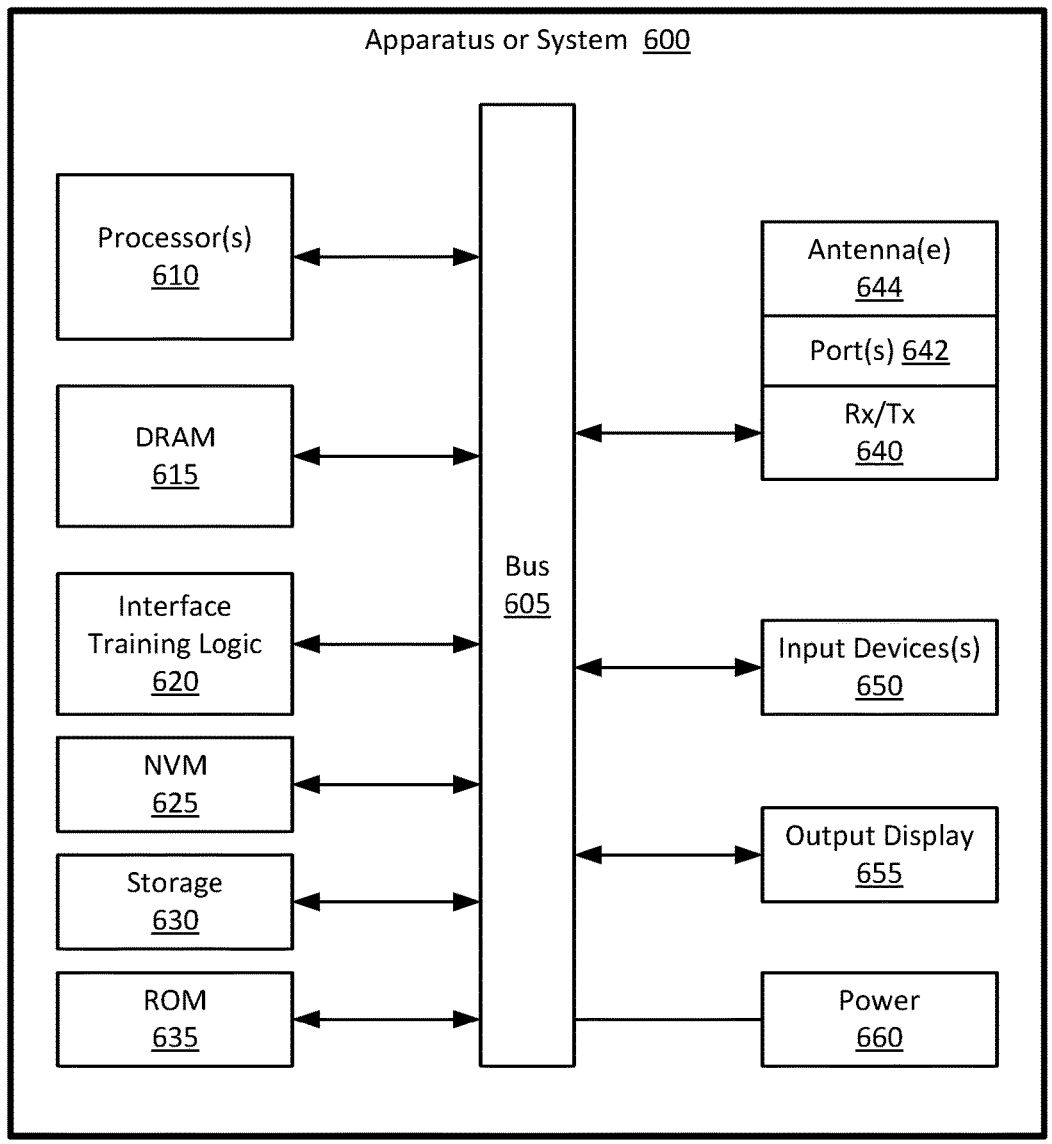
FIG. 6 is an illustration of an apparatus or system to provide enhanced memory interface training according to an embodiment.

FIG. 6 is an illustration of an apparatus or system to provide enhanced memory interface training according to an embodiment. In this illustration, certain standard and well-known components that are not germane to the present description are not shown. Elements shown as separate elements may be combined, including, for example, an SoC (System on Chip) combining multiple elements on a single chip. An apparatus or system 600, such as a computing system, may include, but is not limited to, a personal computer or server.

In some embodiments, the apparatus or system 600 includes processing means (or processing units) such as one or more processors 610 coupled to one or more buses or interconnects, shown in general as bus 605. The processors 610 may comprise one or more physical processors and one or more logical processors. In some embodiments, the processors may include one or more general-purpose processors or special-processor processors. The bus 605 is a communication means for transmission of data. The bus 605 is illustrated as a single bus for simplicity, but may represent multiple different interconnects or buses and the component connections to such interconnects or buses may vary. The bus 605 shown in FIG. 6 is an abstraction that represents any one or more separate physical buses, point-to-point connections, or both connected by appropriate bridges, adapters, or controllers. In some embodiments, a processor 610 includes a memory controller or operates with an external memory controller.

In some embodiments, the apparatus or system 600 further comprises a random access memory (RAM) 615 or other dynamic storage device or element as a main memory for storing information and instructions to be executed by the processors 610. Main memory 615 may include, but is not limited to, dynamic random access memory (DRAM), as illustrated in FIG. 6.

In some embodiments, the apparatus or system 600 further includes interface training logic 620, which is illustrated as, for example, a separate element for ease of illustration. In some embodiments, the interface training logic 620 provides interface training for a high speed interface, including application to command and data signals, and may implement delay elements to modify the phase relationship between a signal and an associated strobe. In some embodiments, the interface training logic 620 provides in whole or in part for training including optimizing phase delay for a signal to reduce latency and power consumption caused by such signal phase delay. In some embodiments, the interface training logic includes operations illustrated in FIGS. 1 and 2A-2D.

The apparatus or system 600 also may comprise a nonvolatile memory (NVM) 625; a storage device such as a solid state drive (SSD) 630; and a read only memory (ROM) 635 or other static storage device for storing static information and instructions for the processors 610. NVM 625 may include, for example, block addressable memory device, such as NAND or NOR technologies, phase change memory (PCM), three dimensional cross point memory, or other byte addressable nonvolatile memory devices, memory devices that use chalcogenide phase change material, resistive memory, nanowire memory, ferro-electric transistor random access memory (FeTRAM), flash memory such as solid state disk (SSD) NAND or NOR, multi-threshold level NAND flash memory, NOR flash memory, magnetoresistive random access memory (MRAM) memory that incorporates memristor technology, spin transfer torque (STT)-MRAM, or a combination of any of the above, or other memory.

In some embodiments, the apparatus or system 600 includes one or more transmitters or receivers 640 coupled to the bus 605 to provide wired or wireless communications. In some embodiments, the apparatus or system 600 may include one or more antennae 644, such as dipole or monopole antennae, for the transmission and reception of data via wireless communication using a wireless transmitter, receiver, or both, and one or more ports 642 for the transmission and reception of data via wired communications. Wireless communication includes, but is not limited to, Wi-Fi, Bluetooth™, near field communication, and other wireless communication standards.

In some embodiments, apparatus or system 600 includes one or more input devices 650 for the input of data, including hard and soft buttons, a joy stick, a mouse or other pointing device, a keyboard, voice command system, or gesture recognition system.

In some embodiments, the apparatus or system 600 includes an output display 655, where the display 655 may include a liquid crystal display (LCD) or any other display technology, for displaying information or content to a user. In some environments, the display 655 may include a touch-screen that is also utilized as at least a part of an input device 650. Output display 655 may further include audio output, including one or more speakers, audio output jacks, or other audio, and other output to the user.

The apparatus or system 600 may also comprise a battery or other power source 660, which may include a solar cell, a fuel cell, a charged capacitor, near field inductive coupling, power adapter, or other system or device for providing or generating power in the apparatus or system 600. The power provided by the power source 660 may be distributed as required to elements of the apparatus or system 600.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an apparatus includes an interface for at least one signal; and interface training logic capable of automatically adjusting a phase relationship between the signal and a strobe or clock, including establishing a phase delay of the signal and a phase delay of the strobe or clock for training of the interface, wherein the interface training logic is capable of determining a phase delay reduction for the signal subsequent to measurement of an eye margin for the signal.

In some embodiments, the interface training logic is capable of identifying a maximum allowable signal phase delay reduction by subtracting from a current strobe phase delay a defined minimum limit for the strobe phase delay.

In some embodiments, the interface training logic is capable of adjusting the phase delay reduction based at least in part on a change in hold edge measurement after application of the phase delay reduction.

In some embodiments, the interface training logic is capable of increasing the signal phase delay upon determining a difference between the hold edge measurements is greater than the difference between the current strobe phase delay and the defined minimum limit for the strobe phase delay.

In some embodiments, the interface training logic is capable of reducing the signal phase delay gradually.

In some embodiments, the interface training logic is capable of adjusting the phase delay reduction based at least in part on a change in hold margin after application of the phase delay reduction.

In some embodiments, the interface training logic is further capable of reducing the phase delay upon determining that a measured hold margin after application of delay reduction plus a current delay in the strobe or clock is less than a measured hold margin before application of the phase delay reduction.

In some embodiments, the signal is one of a data signal and a command signal.

In some embodiments, the determined delay reduction for the signal provides for one or more both of a latency reduction for the apparatus and a power use reduction for the apparatus.

In some embodiments, a non-transitory computer-readable storage medium having stored thereon data representing sequences of instructions that, when executed by a processor, cause the processor to perform operations including adjusting a phase relationship between a signal and a strobe or clock for training of an interface, wherein adjusting the phase relationship includes establishing a phase delay of the signal and a phase delay of the strobe or clock for the training of the interface; measuring an eye margin for the signal; and automatically normalizing the phase delay of the signal subsequent to measuring the eye margin by determining a phase delay reduction and applying the phase delay reduction to the signal.

In some embodiments, the medium further includes instructions for identifying a maximum allowable delay reduction by subtracting from a current strobe phase delay a defined minimum limit for the strobe phase delay.

In some embodiments, the medium further includes instructions for adjusting the phase delay reduction based at least in part on a change in hold edge measurement after application of the phase delay reduction.

In some embodiments, adjusting the phase delay reduction includes increasing the signal phase delay upon determining that a difference between the hold edge measurements is greater than the difference between the current strobe phase delay and the defined minimum limit for the strobe phase delay.

In some embodiments, the signal phase delay is reduced gradually.

In some embodiments, the medium further includes instructions for adjusting the signal phase delay reduction based at least in part on a change in hold margin after application of the phase delay reduction.

In some embodiments, the medium further includes instructions for reducing the phase delay upon determining that a measured hold margin after application of delay reduction plus a current delay in the strobe or clock is less than a measured hold margin before application of the phase delay reduction.

In some embodiments, the signal is one of a data signal and a command signal.

In some embodiments, an apparatus includes means for adjusting a phase relationship between a signal and a strobe or clock for training of an interface, wherein adjusting the phase relationship includes establishing a phase delay of the signal and a phase delay of the strobe or clock for the training of the interface; means for measuring an eye margin for the signal; and means for automatically normalizing the phase delay of the signal subsequent to measuring the eye margin by determining a phase delay reduction and applying the phase delay reduction to the signal.

In some embodiments, the apparatus further includes means for identifying a maximum allowable delay reduction by subtracting from a current strobe phase delay a defined minimum limit for the strobe phase delay.

In some embodiments, the apparatus further includes means for adjusting the phase delay reduction based at least in part on a change in hold edge measurement after application of the phase delay reduction.

In some embodiments, adjusting the phase delay reduction includes increasing the signal phase delay upon determining that a difference between the hold edge measurements is greater than the difference between the current strobe phase delay and the defined minimum limit for the strobe phase delay.

In some embodiments, the signal phase delay is reduced gradually.

In some embodiments, the apparatus further includes means for adjusting the signal phase delay reduction based at least in part on a change in hold margin after application of the phase delay reduction.

In some embodiments, the apparatus further includes means for reducing the phase delay upon determining that a measured hold margin after application of delay reduction plus a current delay in the strobe or clock is less than a measured hold margin before application of the phase delay reduction.

In some embodiments, the signal is one of a data signal and a command signal.

In some embodiments, a computing system includes one or more processors capable of processing data; dynamic random access memory capable of storing data; a transmitter or receiver and antenna capable of transmitting or receiving data; a memory interface for at least one signal; and interface training logic capable of automatically adjusting a phase relationship between the signal and a strobe or clock, including establishing a phase delay of the signal and a phase delay of the strobe or clock for training of the interface, wherein the interface training logic is capable of determining a phase delay reduction for the signal subsequent to measurement of an eye margin for the signal.

In some embodiments, the interface training logic is capable of identifying a maximum allowable signal phase delay reduction by subtracting from a current strobe phase delay a defined minimum limit for the strobe phase delay.

In some embodiments, the interface training logic is capable of reducing the signal phase delay gradually, the interface training logic being capable of adjusting the phase delay reduction based at least in part on a change in hold margin after application of the phase delay reduction.

What is claimed is:

1. A semiconductor chip, comprising:
   an interface circuit for at least one signal; and
   interface training logic circuitry to automatically adjust a phase relationship between the signal and a strobe or clock, including establishment of a phase delay of the signal and a phase delay of the strobe or clock for training of the interface circuit;
   wherein the interface training logic circuitry is to determine a phase delay reduction for the signal subsequent to measurement of an eye margin for the signal in which the phase delay reduction is constrained by a maximum allowable signal phase delay reduction, and, the maximum allowable signal phase delay reduction is a function of a current strobe phase delay and a defined minimum phase limit for the strobe or clock;
   wherein the interface training logic circuitry is also to adjust the phase delay reduction based at least in part on a change in hold margin after application of the phase delay reduction;
   wherein the interface training logic circuitry is also to reduce the phase delay of the signal gradually.

2. The semiconductor chip, of claim 1, wherein the interface training logic circuitry is to identify the maximum allowable signal phase delay reduction by subtraction from the current strobe phase delay the defined minimum phase limit for the strobe or clock.

3. The semiconductor chip, of claim 2, wherein the interface training logic circuitry is to adjust the phase delay reduction based at least in part on a change in hold edge measurement after application of the phase delay reduction.

4. The semiconductor chip, of claim 3, wherein the interface training logic circuitry is to increase the phase delay of the signal upon determination of a difference between the hold edge measurement being greater than the difference between the current strobe phase delay and the defined minimum phase limit for the strobe or clock.

5. The semiconductor chip, of claim 1, wherein the interface training logic circuitry is to reduce the phase delay of the signal upon determination that a measured hold margin after application of the phase delay reduction plus a current delay in the strobe or clock is less than a measured hold margin before application of the phase delay reduction.

6. The semiconductor chip, of claim 1, wherein the signal is one of a data signal and a command signal.

7. The semiconductor chip, of claim 1, wherein the determined phase delay reduction for the signal provides for one or more both of a latency reduction for the semiconductor chip and a power use reduction for the semiconductor chip.

8. A non-transitory computer-readable storage medium having stored thereon data representing sequences of instructions that, when executed by a processor, cause the processor to perform operations comprising:

adjusting a phase relationship between a signal and a strobe or clock for training of an interface, wherein adjusting the phase relationship includes establishing a phase delay of the signal and a phase delay of the strobe or clock for the training of the interface;

measuring an eye margin for the signal; and automatically normalizing the phase delay of the signal subsequent to measuring the eye margin by determining a phase delay reduction, the phase delay reduction constrained by a maximum allowable signal phase delay reduction, and, the maximum allowable signal phase delay reduction being a function of a current strobe phase delay and a defined minimum phase limit for the strobe or clock;

adjusting the phase delay reduction based at least in part on a change in hold margin after application of the phase delay reduction; and, applying the phase delay reduction to the signal including reducing the phase delay of the signal gradually.

9. The medium of claim 8, further comprising instructions that, when executed by the processor, cause the processor to perform operations comprising:

identifying the maximum allowable signal phase delay reduction by subtracting from a current strobe phase delay a defined minimum phase limit for the strobe or clock.

10. The medium of claim 9, further comprising instructions that, when executed by the processor, cause the processor to perform operations comprising:

adjusting the phase delay reduction based at least in part on a change in hold edge measurement after application of the phase delay reduction.

11. The medium of claim 10, wherein adjusting the phase delay reduction includes:

increasing the signal phase delay upon determining that a difference between the hold edge measurements is greater than the difference between the current strobe phase delay and the defined minimum phase limit for the strobe or clock.

12. The medium of claim 8, further comprising instructions that, when executed by the processor, cause the processor to perform operations comprising:

reducing the phase delay upon determining that a measured hold margin after application of delay reduction plus a current delay in the strobe or clock is less than a measured hold margin before application of the phase delay reduction.

13. The medium of claim 8, wherein the signal is one of a data signal and a command signal.

14. A computing system comprising:

one or more processors capable of processing data;

dynamic random access memory capable of storing data;

a transmitter or receiver and antenna capable of transmitting or receiving data;

a memory interface for at least one signal; and interface training logic circuitry to automatically adjust a phase relationship between the signal and a strobe or clock, including establishment of a phase delay of the signal and a phase delay of the strobe or clock for training of the memory interface;

wherein the interface training logic circuitry is to determine a phase delay reduction for the signal subsequent to measurement of an eye margin for the signal in which the phase delay reduction is constrained by a maximum allowable signal phase delay reduction, and, the maximum allowable signal phase delay reduction is a function of a current strobe phase delay and a defined minimum phase limit for the strobe or clock;

wherein the interface training logic circuitry is also to adjust the phase delay reduction based at least in part on a change in hold margin after application of the phase delay reduction;

wherein the interface training logic circuitry is also to reduce the phase delay of the signal gradually.

15. The computing system of claim 14, wherein the interface training logic circuitry is to identify a maximum allowable signal phase delay reduction by subtracting from a current strobe phase delay a defined minimum phase limit for the strobe or clock.

* * * * *